United States Patent [19]
Arnstein et al.

[11] Patent Number: 5,889,821
[45] Date of Patent: Mar. 30, 1999

[54] LOW NOISE FRONT-END BLANKING AND INTERLEAVING FOR SATELLITE RECEPTION IN PULSED INTERFERENCE ENVIRONMENTS

[75] Inventors: Donald S. Arnstein, Fairfax, Va.; Francois Assal, Bethesda, Md.; Moshe Lieberman, Rockville, Md.; John I. Upshur, Germantown, Md.

[73] Assignee: Comsat Corporation, Bethesda, Md.

[21] Appl. No.: 808,567

[22] Filed: Feb. 28, 1997

[51] Int. Cl.⁶ .............................. H04B 1/10; H04B 15/00; H04B 7/185

[52] U.S. Cl. .......................... 375/285; 375/259; 375/351; 375/377; 342/358; 455/3.2; 455/67.3; 455/63; 455/223; 455/283

[58] Field of Search ..................................... 375/285, 351, 375/259, 346, 377, 222; 455/3.2, 63, 67.1, 427, 12.1, 223, 283; 342/358, 352; 371/2.1

[56] References Cited

U.S. PATENT DOCUMENTS

| | | | |
|---|---|---|---|
| 4,119,964 | 10/1978 | Johannsen et al. | 455/63 |
| 4,704,736 | 11/1987 | Kasser | 455/223 |
| 4,856,084 | 8/1989 | Richards, Jr. | 455/223 |
| 4,965,854 | 10/1990 | Glazebrook | 375/351 |
| 5,170,489 | 12/1992 | Glazebrook | 455/63 |

*Primary Examiner*—Stephen Chin
*Assistant Examiner*—Betsy L. Deppe
*Attorney, Agent, or Firm*—Sughrue, Mion, Zinn, Macpeak & Seas, PLLC

[57] ABSTRACT

A method and apparatus to enable high-quality digital transmissions to a satellite terminal operating in proximity to a radar source combines interleaving a sequence of channel symbols at a land station before transmission of an RF signal to a satellite, increasing the satellite's EIRP to compensate for the effects of the radar's duty factor on received signal power and code distance, detecting the radar pulses at a satellite terminal, blanking the received RF signal to prevent reception of the signal by the modem at the satellite terminal during the radar's ON time, having the modem recognize and eliminate the effect of the gap in the channel signals on its metric calculation, and de-interleaving the sequence of channel symbols. As a result, satellite terminals operating in proximity to radar sources can provide the same quality of service as if there were no radars operating.

12 Claims, 8 Drawing Sheets

LOW NOISE FRONT-END BLANKING AND INTERLEAVING FOR SATELLITE RECEPTION IN PULSED INTERFERENCE ENVIRONMENTS

FIELD OF THE INVENTION

The present invention is directed to the field of interference suppression in satellite telecommunications systems. Specifically, the present invention relates to a method and apparatus to permit high quality digital satellite telephone service, business services and direct broadcast digital television to satellite terminals operating in proximity with radars, even when the radars are in operation.

BACKGROUND OF THE INVENTION

When satellite telecommunications terminals are operated in proximity to radars (for example, shipboard satellite terminals operating in proximity to radars on or nearby the ship), interruptions and outages can occur at the satellite terminal when the radar is in use, even when the radar is not operating at the same frequency as the satellite signal. FIG. 1 depicts a scenario in which a shipboard satellite terminal 1 receives communication signals from a satellite 2, which relays information from a land earth station 3. An onboard navigation radar 4, which is located in proximity to the satellite terminal 1, will disrupt the functioning of the satellite terminal 1 when the navigation radar 4 is in use.

Depending on weather, location and function, radars may be in operation any time of the day or night, so interference could come from various sources: nearby ships, the same ship on which the satellite terminal is located, airport radars, or airborne early warning systems. Interference could occur even if the satellite terminal were separated from the radar source by several miles. The ability to create a telephone service business which is salable to the public and which meets international standards for availability requires that a means be found for maintaining high communications quality while radars are in use.

Current practice is to avoid operational use of the satellite terminal and nearby radar simultaneously, if possible, because there has been no effective way to use both the satellite terminal and radar simultaneously with the assurance that the telephone service will be maintained at a high level of quality. Disruptions are common when radar equipment is turned on.

FIG. 2 depicts the relevant parts of a conventional end-to-end satellite link. A land station 210 interfaces with terrestrial networks, encodes signals and transmits them to a satellite 220, which relays the signals to a mobile satellite terminal 230, which decodes the signals. The land station 210 includes a transmit modem 211 with forward error correction (FEC), an up-converter 212 to convert the modulated signal from the modem baseband to radio frequency (RF), a high power amplifier 213, an antenna 215, and a diplexer 214 with a bandpass filter to allow the antenna 215 to be used for both transmitting and receiving.

The satellite terminal 230 (or "receive terminal") has an antenna 231, a diplexer 232 with a bandpass filter, a low noise amplifier 233, a down-converter 234 to convert the RF signal to modem baseband, and a receive modem 235 with FEC. Components 231–235 make up the "front-end" of the satellite terminal.

In conventional systems where radar equipment and a satellite terminal are mounted in proximity, e.g., both on the same ship, solutions to the interference problem have been attempted but have not been completely successful. One reason for this may be that, to the inventors' knowledge, no one in the field has taken a serious look at the failure mechanism of communication links with nearby radars.

In a study performed for COMSAT Mobile Communications, it was found that, for L-Band satellite communications on U.S. Navy ships with high powered radars, the failure mechanism related to radar spurious signal energy entering the front-end of the satellite terminal. FIG. 3(a) shows a spectrum and waveform of a radar signal, offset from the band of a satellite receive signal. FIG. 3(b) shows a pulsed radar RF signal in the time domain. $S_O$ is the peak spectral level of the radar signal, $\tau$ is the pulse width of the radar signal, and T is the pulse repetition period. The radar's center frequency 310 is displaced from the satellite front-end frequency band 311 by tens or hundreds of megahertz. Even though spurious emission 312 in the far sideband of the radar may be very low in comparison to the main-band radar signal 313 (typically 50–100 dB down), it is still so strong at small distances that it interferes with the incoming satellite signal.

The data from the COMSAT study can be used to demonstrate, by computation, the various levels of interfering signals that are present in a C-Band terminal on a ship in proximity to a navigation radar. As a baseline, the scenario in Project CHALLENGE ATHENA: A Demonstration of Megabit Data Transmission to U.S. Naval Vessels, Classified Session 23, Paper #2, Milcom '93, Bedford, Mass. (CHALLENGE ATHENA), is used to generate representative numbers. Many variations on this scenario are possible. More powerful satellites will have potentially stronger signal components. Commercial navigation radars may not be as powerful as the Navy's AN/SPS-48, for example. The main conclusions stay the same, however. In order to better understand the power and dynamic range relationship among the various signals, an analysis was conducted to independently estimate the relative levels of wanted and unwanted signals within the configuration of the ship's earth station as described in CHALLENGE ATHENA.

Following the scenario from CHALLENGE ATHENA, it is assumed that a Navy carrier stationed between Norfolk, Va. and the eastern Caribbean is receiving a wideband 1.544 Mbps signal from an INTELSAT V (F6) satellite located over the Atlantic Ocean, at 310° E. The satellite is transmitting the signal via a global antenna. The satellite operating effective isotropic radiated power (EIRP) is taken as 23.5 dBW. The elevation angle from the ship terminal to the satellite was calculated to be 45.6°, and the path loss at 4.15 GHz was calculated to be 196.3 dB. Table 1 summarizes the ship's terminal receive characteristics.

Link analysis was conducted to determine the received signal power and noise power (N) at the output of the terminal's antenna flange. Noise power levels were calculated using N=kTB for full terminal bandwidth (500 MHz), transponder bandwidth (40 MHz) and signal bandwidth (1.85 MHz). The results are summarized in Table 2.

TABLE 1

Terminal Receive Characteristics

| PARAMETER | VALUE |
|---|---|
| Terminal (INTELSAT Std G) | STD G |
| Radome Diameter (m) | 2.74 |
| Radome Loss (dB) | 0.5 |
| Radome Noise temperature (K.°) | 34 |

TABLE 1-continued

Terminal Receive Characteristics

| PARAMETER | VALUE |
|---|---|
| Antenna Diameter (m) | 2.2 |
| Antenna gain (dBi) @ 4.15 GHz | 37.5 |
| Antenna Sidelobe Gain (dBi) | $G(\phi) = 32 - 25\log(\phi)$ |
| Antenna Noise temperature (K.°) | 25 |
| LNB Noise temperature (K.°) | 80 |
| System Noise Temperature (K.°) | 139 |
| Terminal G/T (dB/K) | 15.6 |
| Terminal Bandwidth (MHz) | 500 |

TABLE 2

Received Signal and Noise Analysis

| PARAMETER | VALUE |
|---|---|
| Satellite Saturated EIRP (dBW) | 25.5 |
| Output Backoff (dB) | 2.0 |
| Satellite Operating EIRP (dBW) | 23.5 |
| Path Loss (dB) @ 4.15 GHZ | 196.3 |
| Pointing Error (dB) | 1.0 |
| Terminal Antenna Gain (dBi) | 37.5 |
| Terminal Radome Loss (dB) | 0.5 |
| Received Signal Strength (dBm) | −106.8 |
| System Noise Temperature (dBK.°) | 21.4 |
| Boltzmann's Constant | −228.6 |
| Noise Power Density (dBm/Hz) | −177.2 |
| Signal Bandwidth, 1.85 MHz (dBHz) | 62.7 |
| Noise Power in Signal Bandwidth (dBm) | −114.5 |
| Transponder Bandwidth, 40 MHz (dBHz) | 76.0 |
| Noise Power in Transponder Bandwidth (dBm) | −101.2 |
| Terminal Bandwidth, 500 MHz (dBHz) | 87.0 |
| Noise Power in Terminal Bandwidth (dBm) | −90.2 |

The RF interference source to the STD G terminal, located on a sponson (a small flat structure that projects over the side of a ship) about 100 meters away from the Carrier's mast, was the AN/SPS-48C surveillance radar. The AN/SPS-48 is a three dimensional, long range air surveillance radar. It uses a combination of mechanical scanning in azimuth and electronic beam steering in elevation to provide position and altitude information. Table 3 summarizes the AN/SPS-48 performance characteristics.

TABLE 3

AN/SPS-48 Performance Characteristics

| ITEM | PARAMETER | VALUE |
|---|---|---|
| Antenna | Size | 17 × 18 |
| | Beamwidth (deg) | 1.6° × 1.6° |
| | Gain (dBi) | 39 |
| Transmit Power | Peak (MW) | 2.2 |
| | Average (kW) | 35 |
| Signal | Frequency (GHz) | 2.9–3.1 |
| | Pulse Width (μsec) | 9 and 27 |
| | PRF (Hz) | 342–2778 |

The methodology employed here is to use the AN/SPS-48 radar published characteristics along with a free space loss analysis to determine typical interference levels. Consider the case where an INTELSAT Std-G terminal is receiving an unwanted signal from a AN/SPS-48 radar located 100 m away. The assumption is that the interference signal is received from the radar's antenna sidelobe (assumed to be −40 dB) and enters the INTELSAT terminal via its own antenna sidelobe. The elevation angle from the terminal to the radar was calculated to be 11 degrees. For a worst case analysis, it is assumed that the radar and the satellite are at the same azimuth angle relative to the terminal.

The radar signal presents two interference components to the terminal. One such component results from spectral energy in the out-of-band emission region of the AN/SPS-48. More precisely, low levels of energy emitted by the AN/SPS-48 radar in its out-of-band region enter the INTELSAT terminal in its own receive band. Discussions with the manufacturer of the radar, and measured spectral data under laboratory conditions, suggest emission levels of 90 dB below peak. However, under operational conditions, in the field and in particular with older equipment, these levels could be 10 or 20 dB higher and still meet MIL-STD-469A requirements for electromagnetic compatibility. Gawthrop, P. E., and Patrick, G. M., Ground-Based Weather Radar Compatibility with Digital Radio-Relay Microwave Systems, U.S. Department of Commerce NTIA Report 90-260, March 1990, section 5 ("Gawthrop"), reports on spurious levels for commercial navigation radars in the 50 dB to 60 dB down range, at several hundred MHz separation.

The other interference component results from the AN/SPS-48 inband emission which enters the INTELSAT terminal outside the diplexer pass band. FIG. 3(a) illustrates the power spectrum of a pulsed radar. The center frequency for the AN/SPS-48 is 2.96 GHz and its signal bandwidth is on the order of 37 kHz. The center frequency of the INTELSAT G terminal is at 3.95 GHz. Given that the INTELSAT G terminal employs a diplexer whose out-of-band rejection is 70 dB, any signal emitted by the radar in its own central band will be received by the satellite terminal 70 dB down.

Referring to FIG. 3(a), the peak spectral level (So) is the product of the average transmit power ($P_{av}$) and the pulse width (τ). If the desired peak spectral level is in dB, then the corresponding product is achieved by assigning a dB value to the average transmit power and pulse width as seen in the following equation.

$$S_O = P_{av} + \tau,$$

At the input to the LNA 233 (FIG. 2), the interfering signal consists of two major components. One component, $P_{int}$, is due to the radar's out-of-band emission in the terminal's diplexer 500 MHz pass-band (also in dB):

$$P_{int} = S_o - 90 + 87$$

The other component, $P_{radar}$, is due to the radar's in-band emission in the satellite terminal's stop-band region (−70 dB):

$$P_{radar} = P_{av} - 70$$

The relative power level between the interference caused by the radar's out-of-band and its in-band signals is, $$\begin{aligned}[P_{int}/P_{radar}] &= S_o - 90 + 87 - (P_{av} - 70) \\ &= S_o - 90 + 87 - (S_o - \tau - 70) \\ &= S_o - 90 + 87 - (S_o + 45.7 - 70) \\ &= 21.3 \text{ dB}\end{aligned}$$

This result shows that improvements to the diplexer will not help, since the noise entering the INTELSAT G terminal front end from the radar's out-of-band emission is about 21 dB larger than the pulses that pass through the diplexer stop band. As a consequence, it should be noted that, when RFI hits the terminal, the predominant effect at the LNA 233 is due to the radar's out-of-band emission and not the main pulses.

Thus, for the close-in distances between a ship's radar and its satellite terminal, the spurious emission entering the front-end is more powerful than the (diplexer-filtered) main band energy of the radar. The spurious emission is sufficiently strong, and the pulse duration is sufficiently long, that when a pulse is "ON" it will disrupt the convolutional decoder normally used with modems on satellite terminals. Once errors occur, the decoder may or may not be able to recover during the noise-free "OFF" period of the radar because error events and noise have been added to the digital bit stream during the ON condition.

This failure mechanism is illustrated in FIG. 4, which treats the radar ON and OFF periods as changes in the instantaneous carrier-to-noise ratio (C/No) that are seen by the convolutional decoder. This analogy is valid because it is well known in the art that the time waveform response of the satellite terminal to the radar pulse is a noise-like signal (incoherent) whose duration is the same as the radar pulse, as shown in FIG. 5. Note also that the satellite terminal's response sometimes includes an impulsive "click" at the start and stop of the radar pulse. See Gawthrop, supra.

FIG. 4 depicts the relative time periods of radar pulses $\tau$, pulse repetition period T, channel symbols S (encoded information bits), convolutional constraint lengths L and path metric memory M. FIG. 4 shows that, based on a typical satellite terminal bit rate of 1.544 Mbps, and a typical radar pulse duration $\tau$, ordinary Viterbi algorithm or sequential decoding algorithm convolutional decoders get "swamped" (overwhelmed) by the elevated noise level caused by the radar pulse. This occurs because $\tau$ lasts for several constraint lengths of the convolutional code in the case of the Viterbi algorithm, and a large fraction of a constraint length in the case of the sequential algorithm. $\tau$ may also exceed the path metric memory size M, which typically extends back about three constraint lengths.

Conventional solutions to this problem partially or inadequately address getting end-to-end performance to be consistently and reliably within stringent bit error rate (BER) conditions, regardless of the presence or absence of the radar signal.

One approach adds a diplexing filter with better cutoff characteristics to the diplexer 232 of the conventional satellite terminal 230 depicted in FIG. 2. However, this does not eliminate the in-band energy which is causing failure of the decoder, as discussed supra.

A second approach adds a pulse blanking circuit to the satellite terminal 230 that opens when the radar pulse is ON. However, if the blanker is on the antenna side of the diplexer 232, it would disrupt signals transmitted by the terminal (i.e., the return link to land). If the blanker is on the LNA side of the diplexer 232, it does not respond adequately to the radar spurious noise in the satellite band, because this noise has characteristics very different from the radar pulse shape it is trying to detect. FIG. 5 shows the shape of the radar spurious noise which comes through the satellite terminal's front end vs. the shape of the radar pulse. Furthermore, attempting to "sense" the radar pulse on the antenna side of the diplexer 232 and then controlling the blanker on the LNA side does not work because the received radar pulse is very weak compared to the signals transmitted by the terminal. Regardless of where the blanking circuit is placed, and even if it operates correctly to eliminate only the affected channel symbols, the duration of the ON pulse is still too long compared to the convolutional code's constraint length as shown in FIG. 4. Thus, a blanking operation, applied without any further modification of the system, produces periodic outages and a loss of information.

A third technique is to add interleaving and de-interleaving to the conventional satellite system. Interleaving the channel symbols at the transmit modem 211 at the land station 210 and de-interleaving them at the receive modem 235 disperses the channel symbols that are hit by the ON radar pulse, but still leaves elevated levels of effective noise power spectral density on the affected channel symbols. This is a problem because the soft-decision decoder in the receive modem 235 will then propagate the elevated noise within its metric calculations. Satellite digital carriers are normally operated close to threshold. Since the elevated noise from the spurious radar emission can be tens of dB higher than background thermal noise, the radar's duty factor, which may be only a few percent, is effectively multiplied by the difference in noise levels.

A fourth approach is to simply boost the satellite power per carrier as used on a current state of the art terminal. However, increasing the EIRP of the signal from the satellite to the satellite terminal may not be sufficient to overcome the elevated levels of noise during the ON state of the radar. Inordinate increases in EIRP, combined with decreases in the digital data rate, may provide a short-term "fix", in the sense that it is getting some information through, even if not at data rates that were originally intended, but this approach is very wasteful of the satellite resource. Additionally, it requires unusual operational changes like ad-hoc requests for more power, data rate changes, and traffic dumping.

SUMMARY OF THE INVENTION

It is therefore an object of the present invention to enable high-quality digital transmissions to satellite terminals operating in proximity to radars.

It is a further object of the present invention to enable satellite terminals operating in proximity to radars to provide the same quality of service as if there were no radars operating.

These and other objects of the present invention can be realized by providing a method and corresponding apparatus which combines all four of the above-mentioned techniques (filtering, radar pulse blanking, interleaving and increasing satellite EIRP) in a unique and efficient configuration. First, the transmit modem at the land station uses interleaving to disperse the effect of the radar pulse at the mobile satellite terminal.

The satellite also increases its EIRP to compensate for the lost transmission based on the highest duty factor radar anticipated.

The mobile satellite terminal, or "receive terminal", near the radar employs a means to detect the rise and fall of the radar pulse during its ON time. The ON time is coincident with the increase in spurious emission entering the front end of the receive terminal. During the radar's ON time, the received RF signal is blanked out. Pulse blanking is performed such that the G/T (the ratio of gain to noise) of the satellite terminal remains unchanged.

The receive modem de-interleaves the received channel symbols, and the carrier and bit timing recovery in the receive modem are readjusted to handle the blanked out intervals.

The convolutional decoder adjusts the convolutional decoding metric to account for the blanked out intervals.

When the above method of the invention is carried out, service is restored to the level of quality provided by conventional systems as if there were no radar present.

BRIEF DESCRIPTION OF THE DRAWINGS

The present invention will be more clearly understood from the following description in conjunction with the accompanying drawings, wherein.

DETAILED DESCRIPTION OF THE PREFERRED EMBODIMENTS

The basic concept of the present invention is to employ a pulse blanker to entirely eliminate the affected channel symbols when the receive terminal senses the presence of a strong radar (ON) pulse. Since the duty factor of the radar is on the order of a few percent, no attempt is made to keep or use the channel symbols received during the ON pulse. Rather, the invention reduces the effects of the blanked-out channel symbols on the bit error rate (BER) via a modified modem design which incorporates an FEC metric that recognizes and eliminates the effect of blanked-out channel symbols on the metric calculation.

Figure 6A:
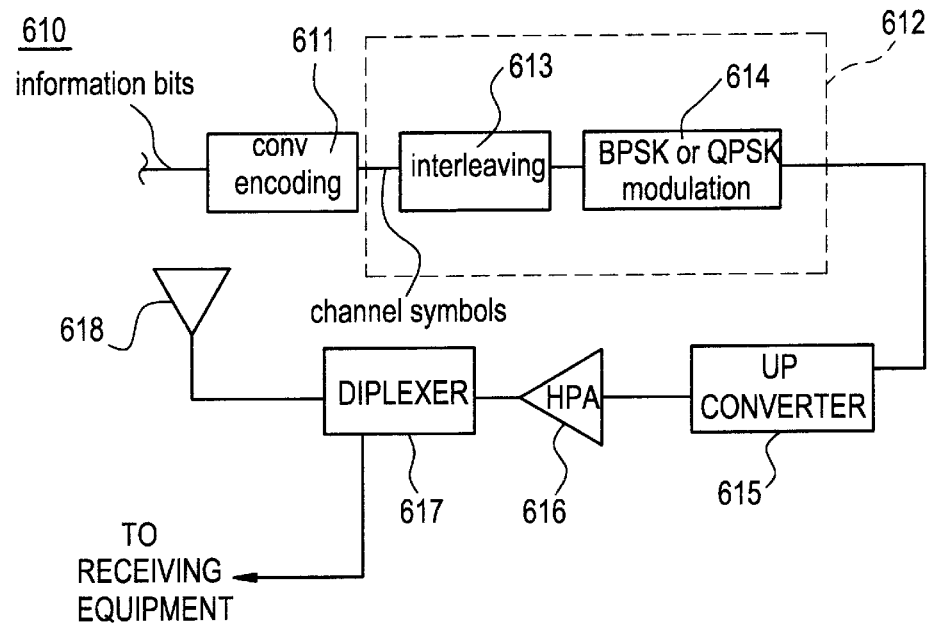
FIGS. 6(a) and 6(b) are block diagrams depicting a first embodiment of the invention.

Referring to FIG. 6(a), a land station 610 comprises a convolutional encoder 611, a transmit modem 612 which includes interleaving means 613 and modulator 614, an up converter 615, a high power amplifier (HPA) 616, a diplexer 617 and an antenna 618.

Information bits from a terrestrial network are encoded by the convolutional encoder 611 and the resulting channel symbols are sent to the interleaving means 613. The interleaving depth is approximately equal to the shortest radar pulse repetition time, but selection of the interleaving span is not critical and does not have to exactly match the pulse repetition period. Radar operators can change the pulse repetition frequency and the center frequency of the radar signal, but selecting a single interleaving frame size and keeping it constant regardless of the radar pulse repetition rate will be sufficient to get adequate randomization of the gap in the channel symbols due to the radar pulse.

After interleaving, the signal is modulated at the modulator 614, converted to RF by the up converter 615, amplified by the HPA 616, and sent through the diplexer 617 to the antenna 618, which transmits it to a satellite (not shown).

The signal sent to the satellite is slightly increased over the level that is adequate with no radar present. This increase constitutes a modified transmission plan which compensates for the energy removed at radar duty factor rate along with an increase needed to compensate for reduced effectiveness of coding when channel symbols get removed by the blanker. Removal of some received channel symbols by the blanking circuit affects the performance by reducing the minimum distance of the code as well as reducing the energy-to-noise ratio per bit available to the decoder. These two effects are described next.

(a) Distance reduction

Convolutional codes are chosen to have good distance properties, which implies that when a particular code word is transmitted, any of the hundreds (or possibly thousands) of incorrect code words are guaranteed to lie no less than some minimum distance from that word. It should be clear that by eliminating code letters in the blanking operation, the minimum distance is reduced, thereby reducing the performance of the code, measured as bit error rate vs. signal to noise ratio.

(b) Energy-to-noise per bit

By taking the ratio of the signal energy which is available at the receiver per bit to the noise power density, one gets a measure of the adequacy of the signal strength. This ratio is given by the relationship $$\frac{E_b}{N_o} = \frac{C}{N_o} \cdot \frac{1}{R}$$

where $C/N_o$ is the carrier-to-noise density on the link, and R is the data rate in bits per second. Removal of some percentage of code letters by the blanker will cause a corresponding reduction in $C/N_o$ and therefore in $E_b/N_O$.

The primary consequence of the above two effects on performance is to increase the bit error probability. To counter these effects, one can reduce the data rate or increase the available EIRP. The invention takes as a premise that the desired end result is to achieve transmission at a particular rate which should not be compromised by the presence of radar. Therefore, it is necessary to increase the EIRP (which leads to an increase in $C/N_o$. It can be demonstrated through simulation or through analysis that the amount of additional EIRP needed to compensate for a radar duty factor of X% is exactly 2X %. Thus, a 5% duty factor radar would require removal of 5% of the received signal through blanking, and would then require a 10% increase in EIRP, half needed to compensate for the actual loss in $E_b/N_o$, and half needed to compensate for the reduced distance properties of the code. This type of adjustment is well within the capability of most satellite systems.

Figure 1:
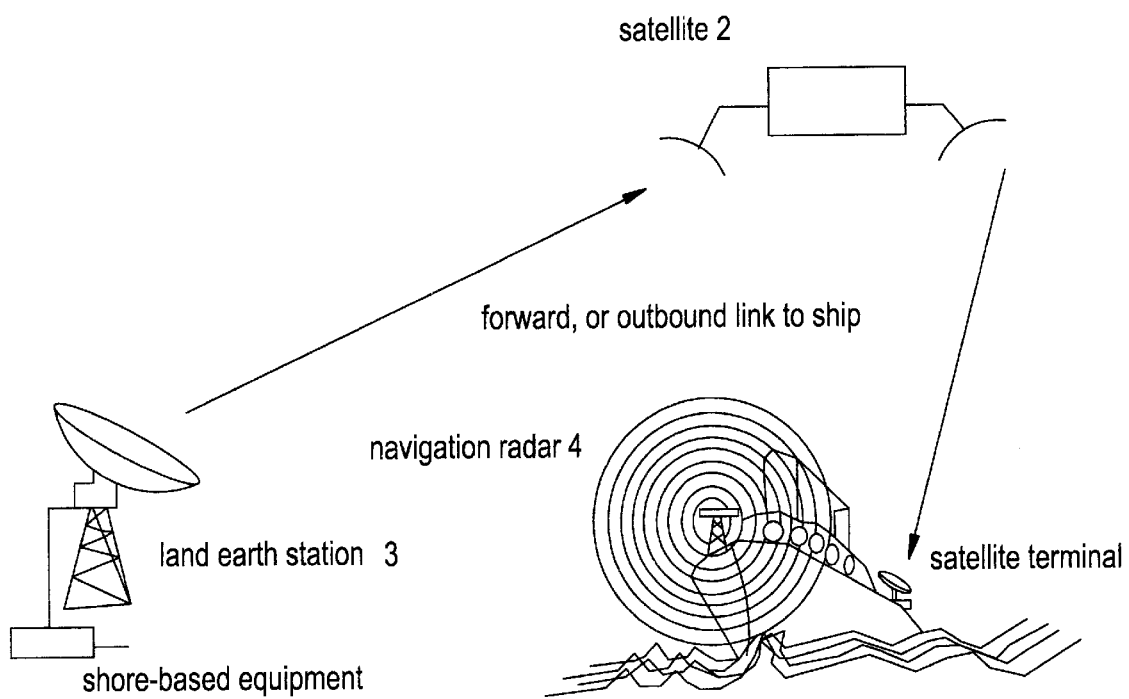
FIG. 1 shows a typical satellite system with a nearby radar source.
Figure 2:
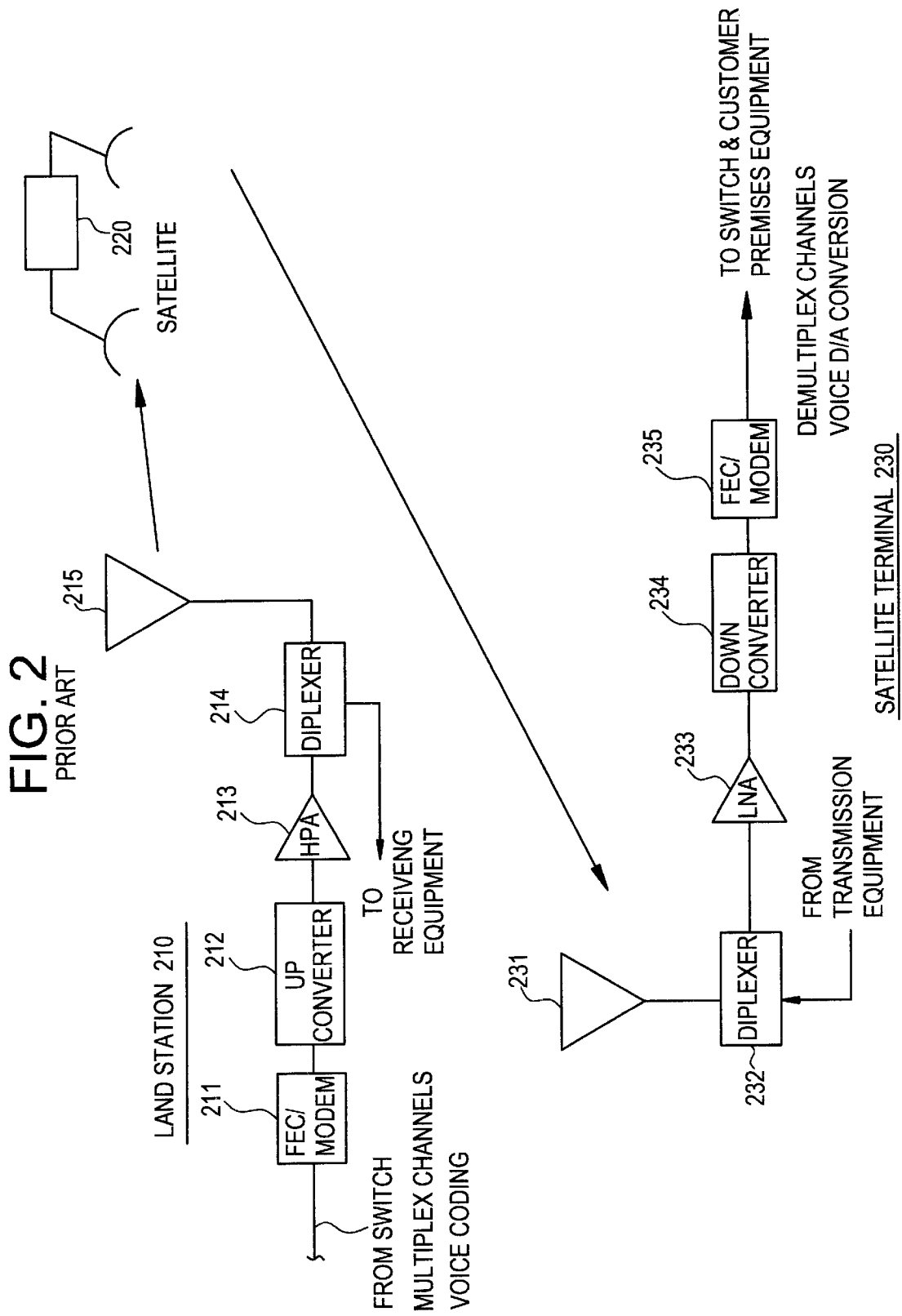
FIG. 2 is a block diagram of the relevant parts of a conventional end-to-end satellite link.
Figure 3A:
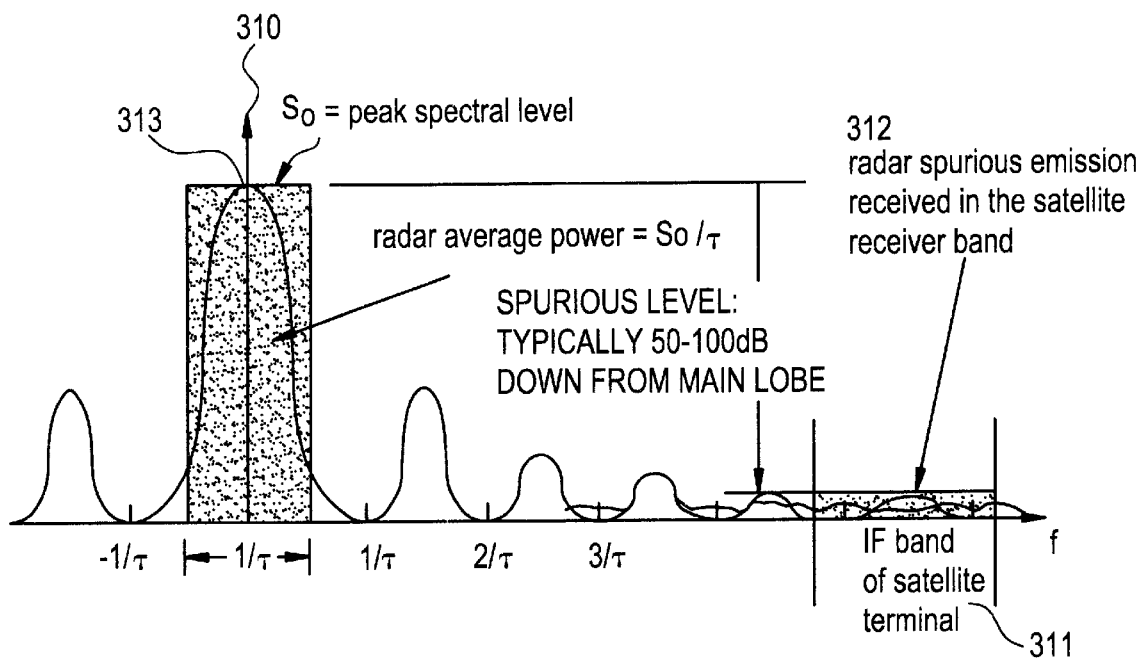
FIG. 3 illustrates the spectrum and waveform of a radar signal, offset from the band of a satellite receive signal.
Figure 3B:
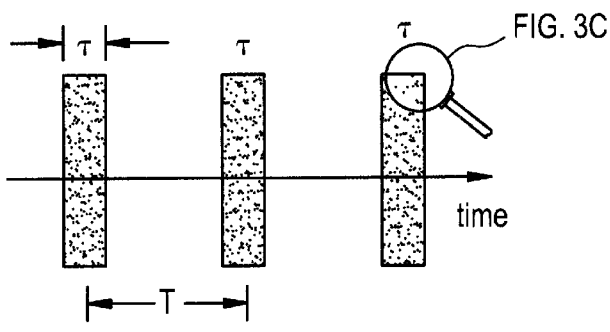
Figure 3C:
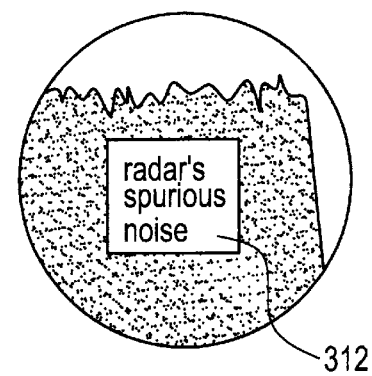
Figure 4:
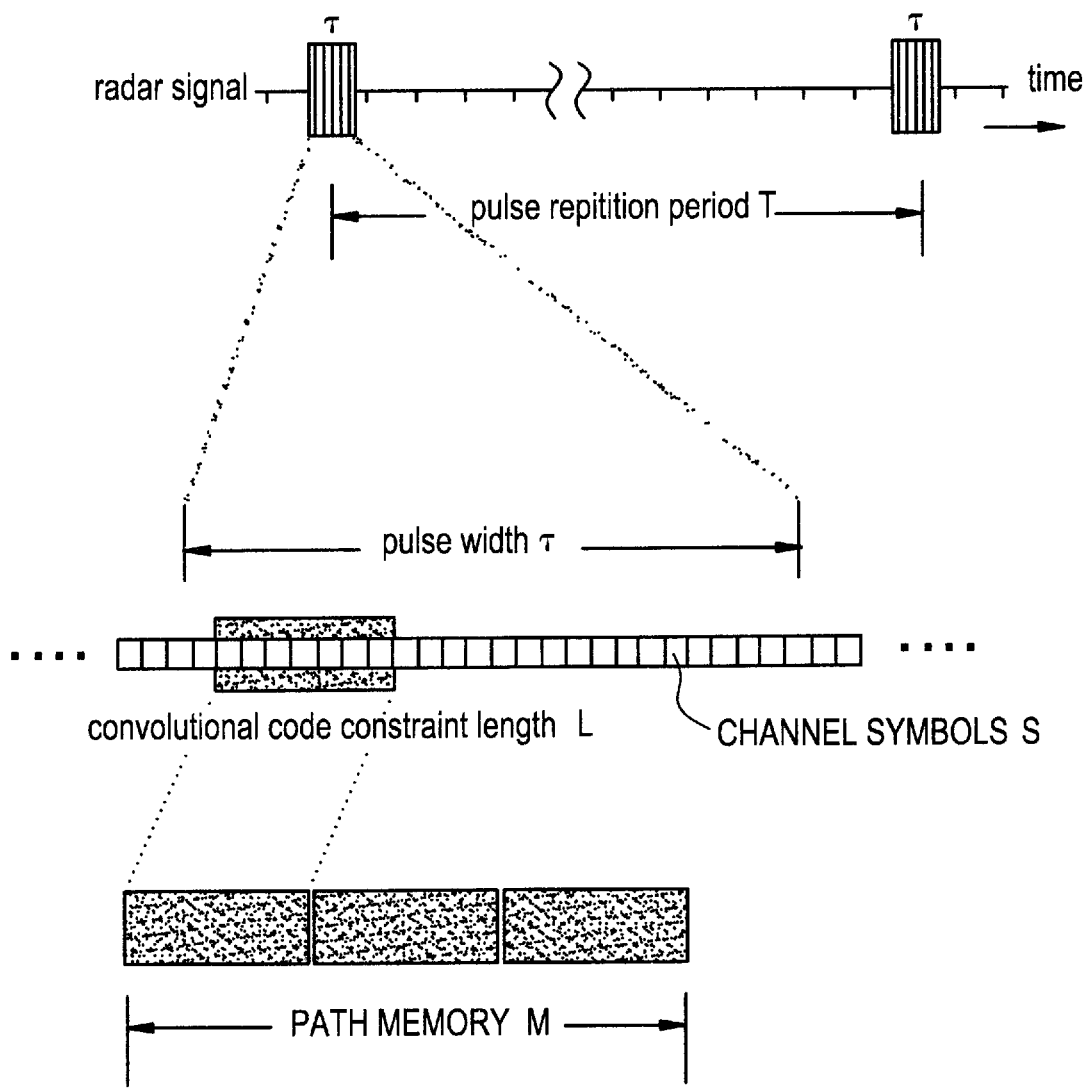
FIG. 4 illustrates the relative time periods of radar pulses, information bits, and convolutional constraint lengths.
Figure 5:
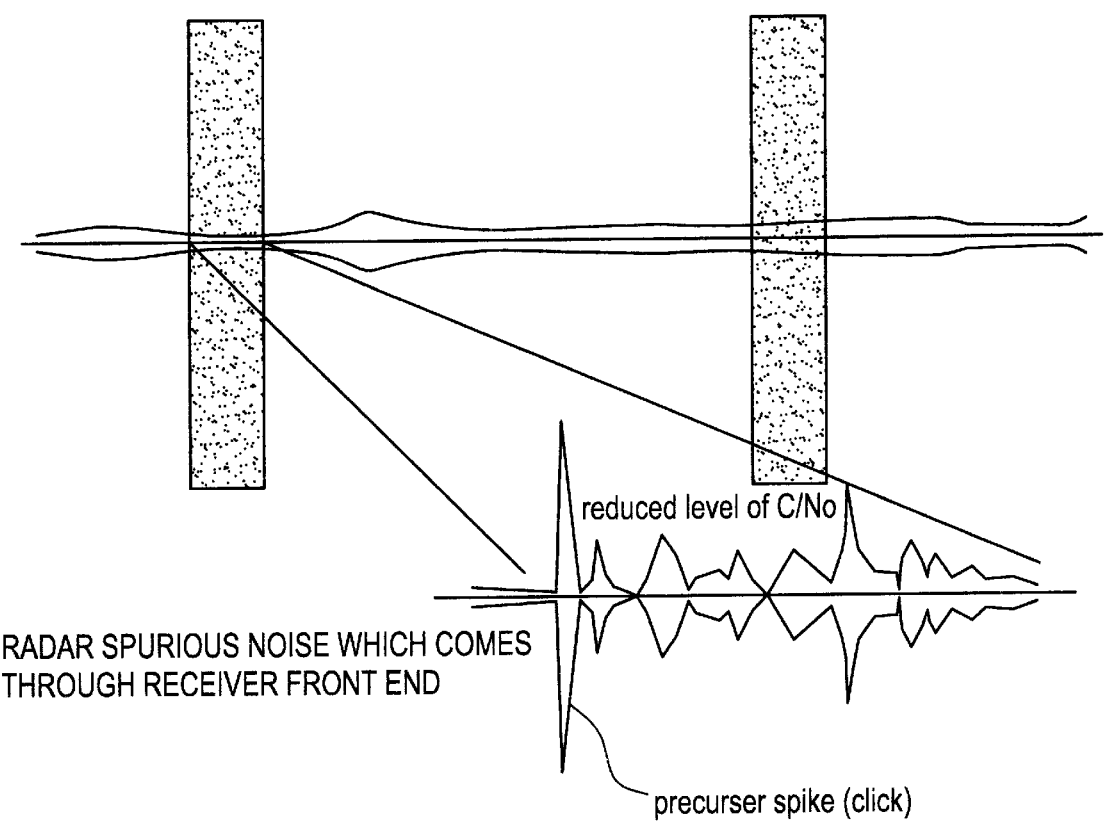
FIG. 5 illustrates radar spurious noise which comes through a satellite receiver front end.
Figure 6B:
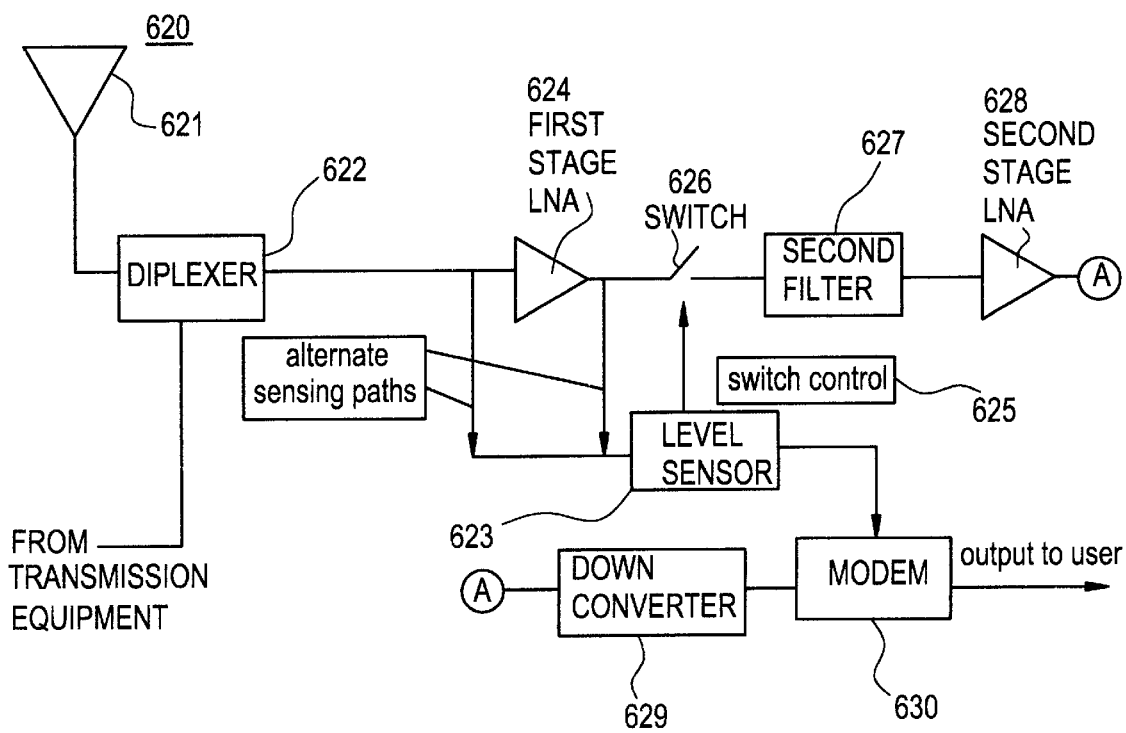

Referring now to FIG. 6(b), which depicts the receive terminal 620, the signal from the satellite and the radar signal both enter the terminal 620 through an antenna 621 and a diplexer 622, which has a first filter whose passband includes the radar. Both signals then go to a level sensor 623, which determines the presence or absence of a radar signal, and to a first stage low noise amplifier (LNA) 624. A level sensor 623 needs to detect the radar's in-band signal, which is a square pulse, not the radar out-of-band noise. As shown in FIG. 5, the radar out-of-band noise is typically many tens of dB below the radar's in band signal. Therefore, the out of band noise does not represent a reliable estimate of the total ON time of the radar.

If the level sensor 623 detects the presence of a radar signal, it activates a switch control 625 to open a switch 626, which remains open for the duration of the radar pulse, thus blanking the radar-affected channel symbols. The level sensor 623 also sends a signal to a modem 630, which incorporates an FEC metric that recognizes and eliminates the effect of blanked-out channel symbols on the metric calculation. Specifically, the decoder metric increment is zero during the radar ON pulse, unlike a conventional modem, in which soft decisions would be made of the noise, which then gets added to the metric. The bandwidth of the carrier recovery and bit timing loops are also adjusted to handle the periodic gaps caused by the blanking operation.

When the level sensor 623 does not detect a radar pulse, the switch 626 is closed and the signal (the satellite signal) goes to a second filter 627, which sends the satellite signal to a second stage LNA 628, a down converter 629 which converts the signal from RF to modem baseband, and finally to a receive modem 630, which de-interleaves and demodulates the signal.

All the components involved in the blanking operation; that is, all the components of the satellite receiver 620 discussed above (except the antenna 621 and the down converter 629), need to be isolated to avoid lowering the G/T of the terminal.

In a second embodiment of the invention, a separate antenna is used to measure radar pulse ON time, allowing the use of an off-the-shelf diplexer and LNA. This may be desirable because building a broadband diplexer such as diplexer 622 may require using inefficient elements such as ridge waveguides which will reduce the G/T of the terminal, require higher prime power and require larger HPAs. Also, the need to maintain sensitivity for the wanted signal may cause serious overloading of the first stage LNA 624 when the radar pulse is present, necessitating the use of a special robust LNA design.

Figure 7:
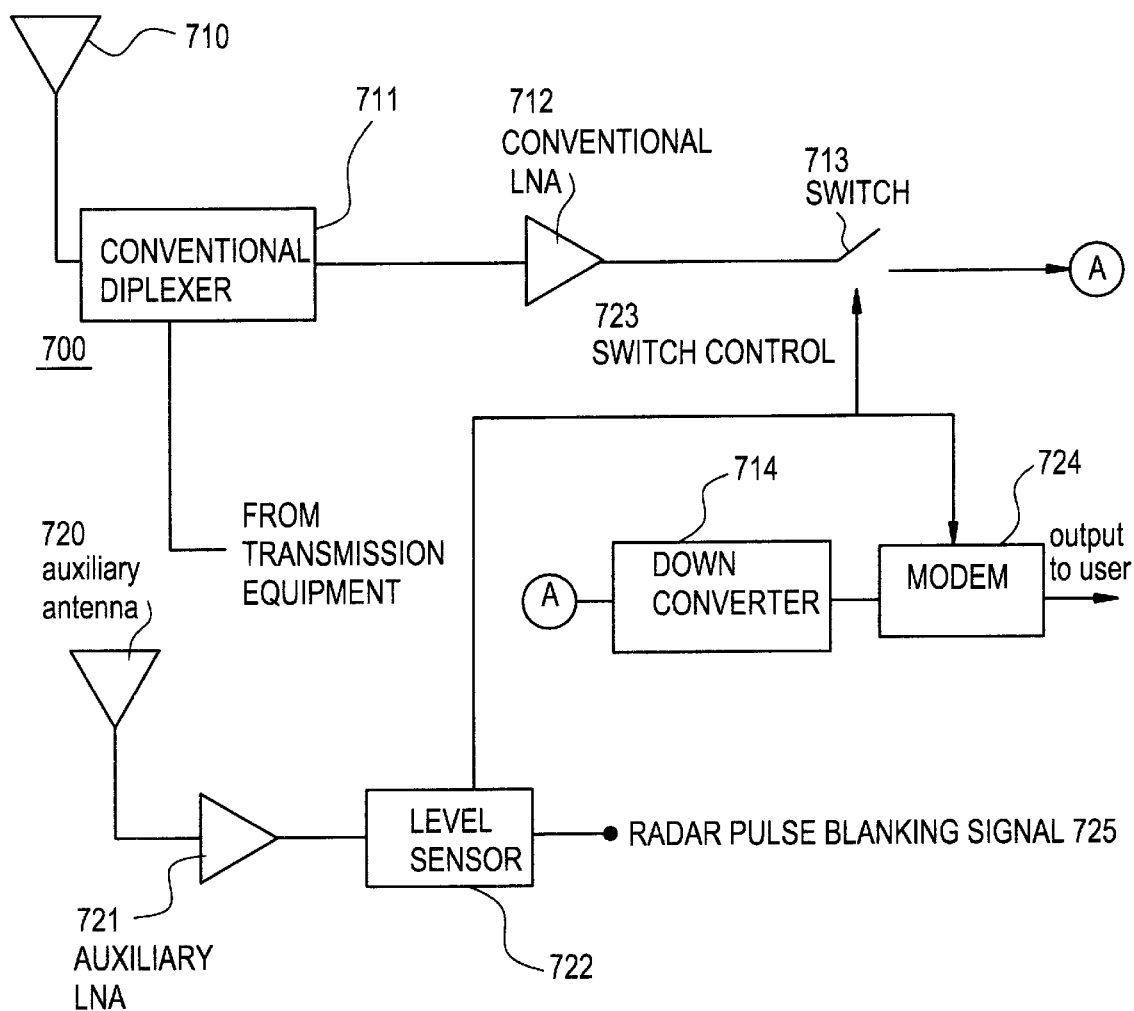
FIG. 7 is a block diagram of a second embodiment of the invention.

FIG. 7 shows a second embodiment of the invention, in which a receive terminal 700 utilizes an auxiliary antenna 720, which is an omni or broadbeam antenna whose passband characteristic is chosen to match the radar tuning range. The radar signal enters through the auxiliary antenna 720, is amplified by an auxiliary LNA 721, and goes to a level sensor 722, which activates switch control 723 to open switch 713, and signals receive modem 724 which recognizes and eliminates the effect of blanked-out channel symbols on the metric calculation, as explained in the description of the first embodiment of the invention.

The satellite signal and the radar signal both enter through main antenna 710, but unlike the first embodiment of the invention, the conventional diplexer 711 filters out the radar signal and allows only the satellite signal to pass to a conventional LNA 712. If the level sensor 722 does not detect a radar pulse, then it does not open switch 713, and the satellite signal passes to down converter 714 and receive modem 724, where it is de-interleaved and demodulated.

The auxiliary antenna 720 can be an omnidirectional antenna, which is much smaller than the main antenna 710, and thus can be placed near the main antenna 710 without increasing the "real estate" requirements of the satellite terminal. The sensitivity requirements for reliable radar pulse edge detection are easy to achieve with a small omnidirectional antenna.

In a variation of this embodiment of the invention, a radar pulse blanking signal 725 distributed by the radar system itself can be used to activate the level sensor 722. Some radar manufacturers provide a blanking signal directly at the radar transmitter that can be distributed to the other electronic devices operated near the radar (e.g., on the same ship). Since blanking also needs to be performed for radars which are not necessarily on the same ship as the satellite terminal, this distributed signal will not protect against radars external to the ship, so the auxiliary antenna 720 is still necessary.

In a third embodiment of the invention, blanking of the radar signal is done at intermediate frequency (IF) or at baseband frequency internal to the modem. Although RF blanking as described in the first two embodiments of the invention has the advantage of removing all signals with elevated noise levels from the receive chain (mixers, down converters, phase lock loops, bit synchronizers, frame synchronizers, etc.), if it is desired to simply accomplish the objective of "zeroing out" the decoder metric increment during the radar ON pulses, this can be achieved in the modem without RF blanking by numerically setting the metric increments to zero during the ON interval. Without RF blanking, the receive terminal front-end does not need to be distributed in two sections (with the components in the blanking operation isolated). However, a trade-off exists between the modem's complexity and the RF front-end's complexity. This embodiment's simpler RF front-end requires a more complex modem design that can withstand bursts of noise, because the radar spurious emissions (in the receive terminal band) are passed through to the modem.

Figure 8:
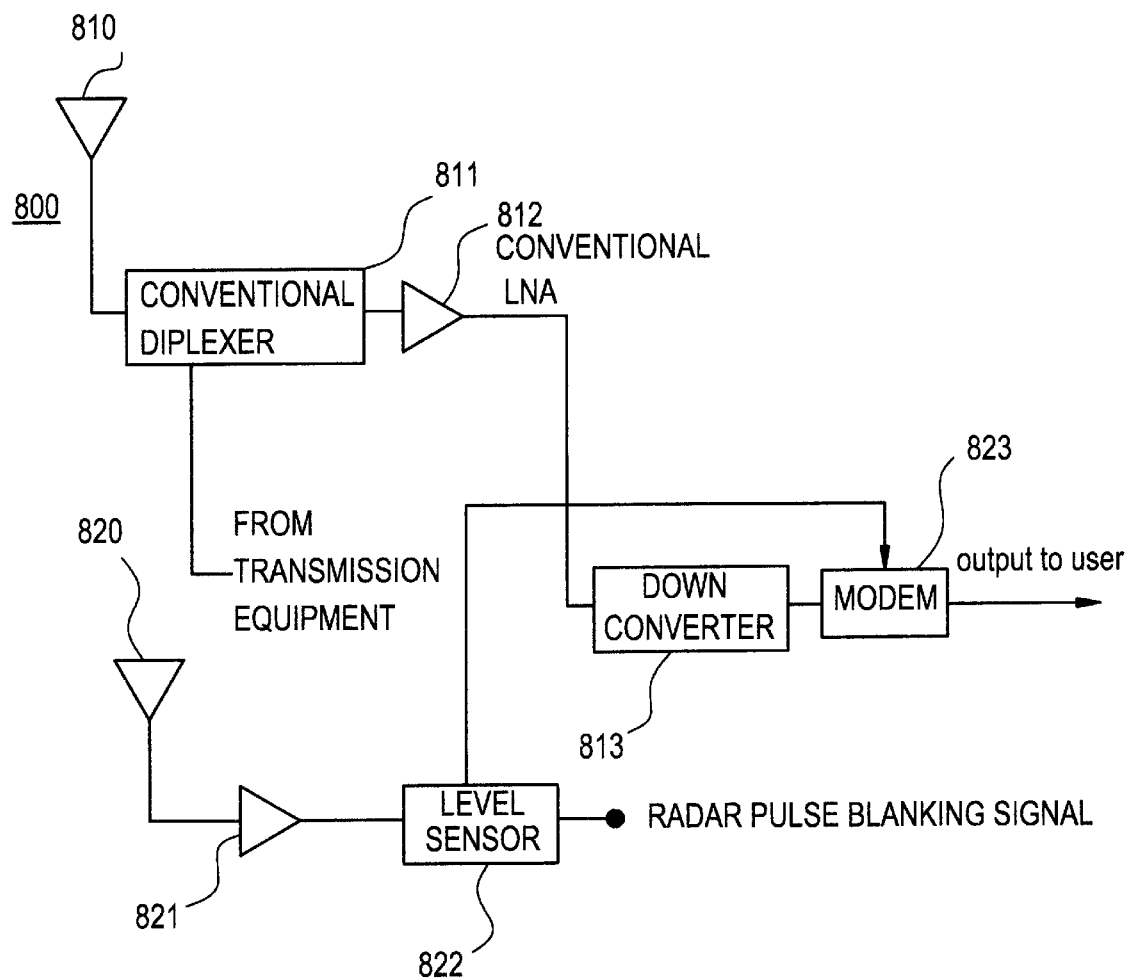
FIG. 8 is a block diagram of a third embodiment of the invention.

FIG. 8 illustrates this embodiment of the invention, where the blanking of the radar signal is done entirely at baseband at the modem. The receive terminal 800 utilizes an auxiliary antenna 820, as in the second embodiment of the invention. The radar signal enters through the auxiliary antenna 820, is amplified by an auxiliary LNA 821, and goes to a level sensor 822, which signals a receive modem 824 which numerically sets its metric increments to zero.

The satellite signal and the radar signal both enter through main antenna 810, and like the second embodiment of the invention, the conventional diplexer 811 filters out the radar signal and allows only the satellite signal to pass to a conventional LNA 812. The satellite signal passes to down converter 813 and receive modem 824, where the signal is de-interleaved and demodulated.

The present invention can be used in the 1.544 Mbps full duplex systems in commercial demand today, as well as in higher data rate systems such as INTELSAT IDR and IBS, and to direct broadcast digital video. The link itself does not need to be full duplex.

While specific embodiments of the invention have been described herein, it will be apparent to those of skill in the art that other modifications may be made within the scope of the invention, and it is intended that the full measure of the invention be determined with reference to the following claims:

We claim:

1. An apparatus to enable high-quality digital transmissions to a satellite terminal operating in proximity to a radar source, comprising:

interleaving means for interleaving a sequence of channel symbols at a land station before transmission of an encoded signal reflecting said sequence of channel symbols to a satellite;

means for increasing said satellite's effective isotropic radiated power to compensate for the effects of a radar duty factor on received power and code distance;

radar detecting means at said satellite terminal to detect a radar pulse;

blanking means at said satellite terminal to prevent reception of said encoded signal by a modem at said satellite terminal during said radar pulse, thus creating a gap in said sequence of channel symbols, said modem having a forward error correction metric capable of recognizing and eliminating the effect of said gap on its metric calculation; and de-interleaving means at said satellite terminal for de-interleaving said sequence of channel symbols.

2. The apparatus of claim 1, wherein said interleaving means has an interleaving depth approximately equal to a minimum anticipated repetition time of said radar pulse.

3. The apparatus of claim 1, wherein said satellite terminal further comprises an antenna for receiving said encoded signal from said satellite and for receiving said radar pulse, and a first filter whose passband includes said encoded signal and said radar pulse.

4. The apparatus of claim 3, wherein said radar detecting means comprises a level sensor for detecting presence or absence of said radar pulse.

5. The apparatus of claim 4, wherein said blanking means comprises a switch, and means for opening said switch when said level sensor detects a presence of said radar pulse and closing said switch when said level sensor detects an absence of said radar pulse.

6. The apparatus of claim 5, wherein said forward error correction metric of said modem has a decoder metric increment, and means for setting said decoder metric increment to zero when said level sensor detects the presence of said radar pulse.

7. The apparatus of claim 5, wherein said satellite terminal further comprises a second filter whose passband includes only said encoded signal, for allowing reception of said encoded signal at said modem when said switch is closed.

8. The apparatus of claim 1, wherein said satellite terminal further comprises an antenna for receiving said encoded signal from said satellite, and a filter whose passband includes only said encoded signal.

9. The apparatus of claim 8, wherein said radar detecting means comprises an auxiliary antenna for receiving said radar pulse and a radar pulse blanking signal from said radar source, and a level sensor for detecting presence or absence of said radar pulse.

10. The apparatus of claim 9, wherein said blanking means comprises a switch, and switching means for opening said switch when said level sensor detects the presence of said radar pulse and closing said switch when said level sensor detects the absence of said radar pulse, thus allowing reception of said encoded signal at said modem when said switch is closed.

11. The apparatus of claim 10, wherein said modem forward error correction decoding metric is incremented with the arrival of new signals, and means for setting said decoder metric increment to zero when said level sensor detects the presence of said radar pulse.

12. A method to enable high-quality digital transmissions to a satellite terminal operating in proximity to a radar source, comprising the steps of:

interleaving a sequence of channel symbols at a land station before transmission of an encoded signal reflecting said sequence of channel symbols to a satellite;

increasing said satellite's EIRP to compensate for the effects of a radar duty factor on received power and code distance;

detecting a radar pulse at said satellite terminal;

blanking said encoded signal at said satellite terminal to prevent reception of said encoded signal by a modem at said satellite terminal during said radar pulse, thus creating a gap in said sequence of channel symbols, said modem having a forward error correction metric capable of recognizing and eliminating the effect of said gap on its metric calculation; and de-interleaving said sequence of channel symbols at said satellite terminal.

* * * * *